United States Patent [19]
Sawada et al.

[11] Patent Number: 4,978,379
[45] Date of Patent: Dec. 18, 1990

[54] METHOD OF JOINING SEMICONDUCTOR SUBSTRATES

[75] Inventors: Renshi Sawada, Tokorozawa; Junji Watanabe, Tokyo, both of Japan

[73] Assignee: Nippon Telegraph and Telephone Corporation, Tokyo, Japan

[21] Appl. No.: 266,304

[22] Filed: Oct. 31, 1988

Related U.S. Application Data

[63] Continuation of Ser. No. 851,773, Apr. 14, 1986, abandoned.

[30] Foreign Application Priority Data

Apr. 19, 1985 [JP] Japan .................................. 60-82609

[51] Int. Cl.$^5$ ...................... C03B 19/06; C03C 27/00
[52] U.S. Cl. ........................................ 65/18.2; 65/36; 65/43; 156/89
[58] Field of Search ................ 65/18.2, 43, 32.2, 18.1, 65/36, 40, 41, 42, 44, 45, 155, DIG. 11; 156/89; 437/62, 67, 238, 240, 925, 974, 209; 148/DIG. 12, DIG. 135, DIG. 159; 29/576 R, 576 S, 590

[56] References Cited

U.S. PATENT DOCUMENTS

| | | | |
|---|---|---|---|
| 2,239,551 | 4/1941 | Dalton | 65/18.2 |
| 2,272,342 | 2/1942 | Hyde | 65/18.2 |
| 3,768,991 | 10/1973 | Rogers | 65/36 |
| 3,909,332 | 9/1975 | Yerman | 65/43 |
| 4,294,602 | 10/1981 | Horne | 65/40 |
| 4,363,647 | 12/1982 | Bachman et al. | 65/18.2 |
| 4,393,573 | 7/1983 | Kato et al. | 29/571 |
| 4,501,060 | 2/1985 | Frye et al. | 65/40 |

FOREIGN PATENT DOCUMENTS

| | | |
|---|---|---|
| 2738614 | 3/1978 | Fed. Rep. of Germany . |
| 214836 | 10/1984 | Fed. Rep. of Germany .......... 65/36 |
| 53-57978 | 5/1978 | Japan . |

OTHER PUBLICATIONS

Miller, Stewart E. (et al); Optical Fiber Telecommunications; Academic Press, Inc., New York, 1979; p. 249.
Nippon Denshin Denwa Kosha, Patent Abstracts of Japan, Jun. 4, 1983, vol. 7, No. 129(E-179) [1274], & JP-A-58-44 723, Mar. 15, '83.
Applied Phys. Lett. 43 (3), Aug. 1, 1983, pp. 263–265.
Davidsohn et al., Proceedings of the IEEE, Sep. 1969, p. 1535, Dielectric Isolated Integrated Circuit Substrate Process.
Kimura et al., Applied Physic Letters, Aug. 1983, p. 265, Epitaxial Film Transfer Technique for Producing Single Crystal Si Film or an Insulating Substrate.

*Primary Examiner*—Kenneth M. Schor
*Attorney, Agent, or Firm*—Frishauf, Holtz, Goodman & Woodward

[57] ABSTRACT

A method of manufacturing a semiconductor substrate includes the steps of performing flame electrolysis on a galss source with an oxyhydrogen flame, spray-depositing the resultant glass particles on a joint surface of a semiconductor substrate, placing another semiconductor substrate on the deposited glass particles and performing heat-treatment, and joining the two substrates by sintering the glass particles.

17 Claims, 3 Drawing Sheets

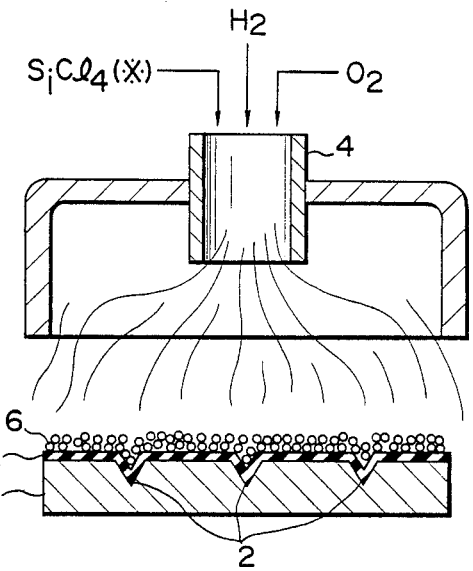
F I G. 1(a)
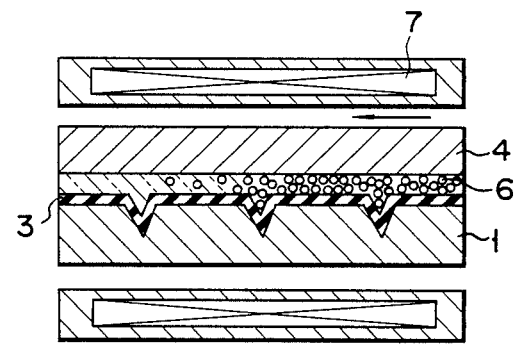
F I G. 1(b)
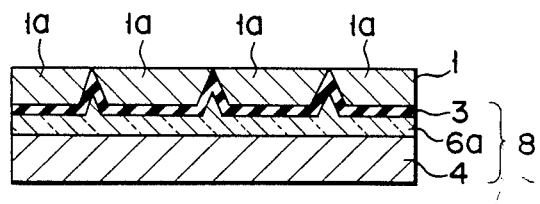
F I G. 1(c)

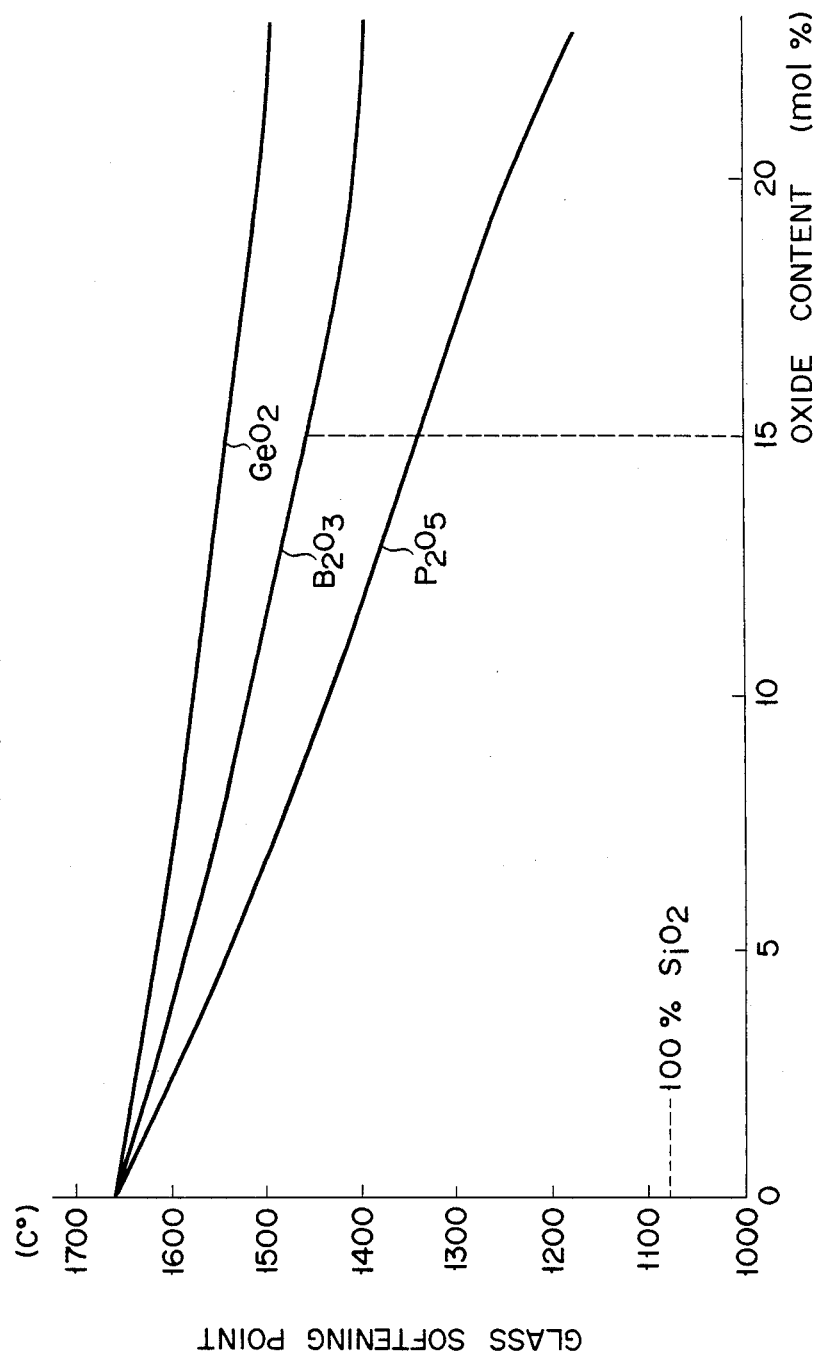

METHOD OF JOINING SEMICONDUCTOR SUBSTRATES

This application is a continuation of application Ser. No. 06/851,773, filed Apr. 14, 1986, now abandoned.

BACKGROUND OF THE INVENTION

The present invention relates to an improved method of joining semiconductor substrates used in a semiconductor device.

In the manufacturing of a semiconductor device, the need often arises to join one semiconductor substrate with another. For example, in order to prepare a high breakdown voltage integrated circuit, various types of dielectric-isolated substrates and their fabrication processes have been proposed to increase a breakdown voltage and improve element isolation. In the process for manufacturing such a dielectric-isolated substrate, the following techniques have been taken into consideration. A semiconductor substrate with an element formation region is supported by another material, or joined with a homogenous or heterogeneous substrate. With this kind of technique, it is necessary to fulfill structural and manufacturing conditions such as the following. First, any grooves on the joint surface of the substrate must be completely filled with a joining agent or the like. Second, harmful impurities cannot be allowed to diffuse into the element formation region of the substrate. Third, heat resistance must be provided. Finally, the process must allow the substrate to be free from crystal defects such as dislocations.

According to a first conventional method of manufacturing a semiconductor substrate, as described by U.S. Davidsohn and Faith Lee, Proceedings of IEEE, Vol. 57, No. 9, September, 1532 (1969) or in U.S. Pat. No. 4,393,573, polycrystalline silicon constituting a support is deposited on a V-grooved semiconductor substrate having a dielectric film thereon to fill the V-grooves. Subsequently, the opposite surface of the substrate having a joint surface is polished by a predetermined thickness to prepare a dielectric isolation structure. However, since deposition according to this method is performed to a thickness of more than 350 $\mu$m by hydrogen reduction reaction using a gas such as trichlorosilane ($SiHCl_3$) gas, a large amount of source gas must be used, and a long deposition time is necessary. In addition, in order to prevent the substrate from warping after the manufacturing process, conditions such as deposition rate and temperature must be strictly controlled. Furthermore, an $SiO_2$ film must be formed by depositing $SiO_2$ a few times to prevent the warping of the substrate, resulting in increased cost.

According to a second conventional method, as described in U.S. Pat. No. 3,909,332, a mixture of silane ($SiH_4$), diborane ($B_2H_6$), and oxygen ($O_2$) is used as the source gas for the glass film to be deposited. After depositing the glass film on the joint surfaces of the two substrates by CVD, the substrates are placed together at the glass film portions and heat-treated under pressure. With this method, however, grooves and projections or recesses on the junction surface of either substrate cannot be filled completely because of the thinness of the glass film. In addition, it is necessary to apply pressure to the substrates. If the grooves and projections or recesses cannot sufficiently filled with the glass film, cracks may occur in the subsequent polishing process, or holes may be left. A resist used in the subsequent photolithography or the like is inserted in the holes and undesirably becomes a contamination source. Furthermore, since the pressure acts to join the substrates, crystal defects are formed in the element formation region of the semiconductor substrate due to the mechanical stress.

According to a third conventional method, as described in Japanese Patent Disclosure No. 53-57978, grooves and projections or recesses formed on the junction surfaces of the substrates are filled with a uniform mixture having a suitable composition of silicon dioxide powder and boric acid or boric anhydride as a joining agent. A support is placed on the substrate, and the resultant structure is heated and compressed, thereby joining the substrate and the support. In order to fill the grooves and the like without gaps, however, it is necessary to apply vibrations with a vibrator or ultrasonic waves, so that the fabrication process is complicated. In addition, it is impossible to obtain a uniform composition. The nonuniform composition varies the melting point of the joining agent. In the heat-treatment process subsequent to the isolation polishing, part of the element region is subjected to movement. Furthermore, since crystal defects are induced by mechanical stress from the compression upon adhesion, electrical characteristics are degraded.

According to a fourth conventional method, as described by M. Kimura, K. Egami, and M. Kanamori, Applied Physics Letters, Vol. 43, No. 3, August 263 (1983), a glass powder, having a melting point of less than 1,000° C. and containing lead-borosilicate ($Pb-B_2O_3-SiO_2$) or a heavy or alkali metal, is dispersed in an organic solvent. After applying the resulting substance to one substrate with a spinner or the like and heated, the substrate is placed on another substrate and reheated under pressure. Because of the low melting point of the glass powder used as a joining agent, however, substrates joined with this method cannot be used in high temperature regions, contamination of the substrates by the heavy metal atoms is significant, and a large number of voids are formed. Furthermore, the compression process upon adhesion is also necessary, thus presenting the same shortcomings as the third method.

None of the conventional methods, then, are without shortcomings, and a semiconductor substrate manufacturing method which fulfills all of the desired conditions is yet to be seen.

SUMMARY OF THE INVENTION

It is an object of the present invention to provide an inexpensive method of manufacturing a semiconductor substrate, wherein the conventional shortcomings can be overcome, grooves and projections or recesses in the joint surface (or contact surface) of the substrate can be filled without gaps with a joining agent, and structural and electrical characteristics are not compromised.

In order to achieve the above object, a method of manufacturing a semiconductor substrate according to the present invention comprises the steps of:

performing flame hydrolysis with an oxyhydrogen flame on a source containing a silicon halogenide compound, and spray-depositing the resultant glass particles containing silicon dioxide onto a joint surface of a first semiconductor substrate; and placing a second substrate serving as a support on the glass particles deposited on the first semiconductor substrate and performing heat-treatment to sinter the glass particles.

According to the semiconductor substrate manufacturing method of the present invention, flame hydrolysis is performed with an oxyhydrogen flame on the source containing a silicon halogenide compound, and the resultant glass particles are spray-deposited on the joint surface of a semiconductor substrate by a burner or the like. By employing these steps, grooves and projections or recesses in the joint surface of the substrate can be filled without gaps.

In addition, since a high purity source which does not contain any heavy or alkali metal is used, autodoping of an impurity from the joining agent to the element formation region can be prevented. As a result, elements to be formed in the region have good electrical characteristics.

Furthermore, in the step of heating the glass particles sandwiched between the two substrates, irrespective of the low sintering temperature, transparentized bulk after sintering has a high heat resistance which can be determined by the dose of boron.

Finally, the volume ratio of the deposited glass particles before sintering and transparentized glass after sintering is controlled by the flow rate of the hydrogen added during spraying by the burner and decreases to 1/10 to 1/50, thus causing a corresponding increase in density. Since the material deposited between the two substrates contracts during the sintering process, it functions as a good adhesive over the entire joint surface, and a compressing means of the type used in the conventional methods is rendered unnecessary. Hence, crystal defects and the like caused by mechanical stress can be eliminated.

Furthermore, a substrate of the same material as the semiconductor substrate with an element formation region can be used. Subsequently stress which may be caused by the joining agent can be reduced.

BRIEF DESCRIPTION OF THE DRAWINGS

FIGS. 1(a) to 1(c) are sectional views showing steps in a manufacturing method according to an embodiment of the present invention;

FIG. 2 is a graph showing change in glass softening point as a function of the oxide content of a melting point control material ($GeO_2$, $B_2O_3$, and $P_2O_5$) contained in $SiO_2$ during the manufacturing process.

DETAILED DESCRIPTION OF THE PREFERRED EMBODIMENT

Figure 3A:
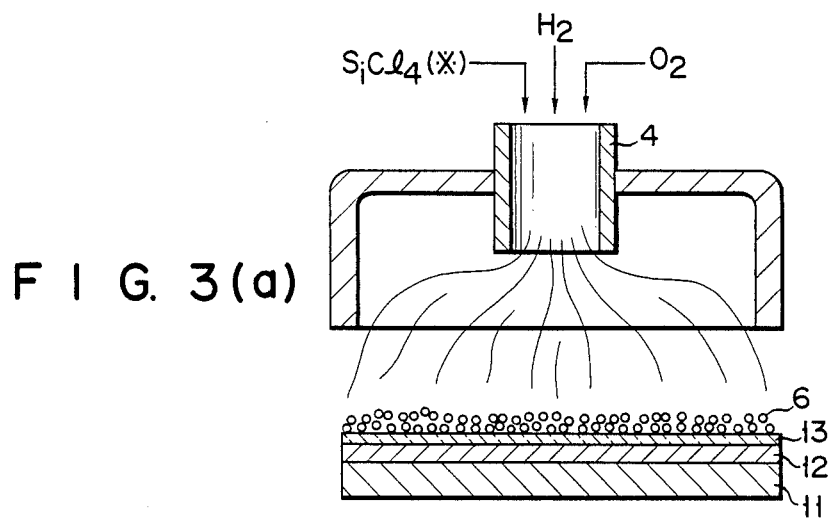
FIGS. 3(a) to 3(c) show another embodiment of the present invention.

An embodiment of the present invention will now be described with reference to the accompanying drawings.

As shown in FIG. 1(a), V-grooves 2 are formed by a known etching method at a predetermined distance from each other on the joint surface of monocrystalline semiconductor substrate 1 consisting of, for example, silicon (Si). Dielectric film 3 (e.g., an $SiO_2$ film) or thermal oxide film is formed over the entire surface including V-grooves 2. Halide gas, having as a major component tetrachlorosilane ($SiCl_4$) or trichlorosilane ($SiHCl_3$) constituting a glass source, is fired by an oxyhydrogen flame from burner 4. As a result of flame hydrolysis reaction, the halide gas becomes fine glass particles 6 containing silicon dioxide ($SiO_2$) as a major component. Particles 6 are then deposited on dielectric film 3 on the surface of substrate 1 including V-grooves 2. Since $SiCl_4$ is normally a liquid, it is poured in a thermostat of, e.g., 840° C., and Ar gas as a carrier gas is supplied to $SiCl_4$ at a flow rate of 200 cc/min to bubble it, thus supplying $SiCl_4$ to burner 4. Oxygen and hydrogen are also supplied to burner 4 to produce the oxyhydrogen flame. In this case, the flow rates of oxygen and hydrogens are, for example, 5 l/min and 1.8 l/min, respectively. The density of particles 6 is controlled by the flow rate of the hydrogen supplied to burner 4 to produce the oxyhydrogen flame. The hydrogen flow rate, and hence the density of particles 6, are preferably reduced to fill the gaps in substrates with, for example, rough surfaces or large warps. In this case, the flow rate of $H_2$ is set to be 1.3 l/min. However, if the V-grooves are formed in the substrate surface, the hydrogen flow rate and hence the density of particles 6 are preferably increased to fill the V-grooves without leaving any gaps. If glass particles 6 are deposited while heating the substrate 1, adhesive properties are further improved, and filling without gaps can be easily accomplished.

Next, as shown in FIG. 1(b), second substrate 4 (e.g., a silicon substrate) to be joined to substrate 1 is placed on substrate 1 through particles 6. Substrates 1 and 4 are then heated to a temperature of 800° C. to 1,300° C. in heating furnace 7. In this case, the heating atmosphere is constituted by He and $O_2$ gases. He gas is effective to eliminate bubbles from glass bulk body 6a, and $O_2$ gas is effective to completely convert the particles to transparentized glass. This causes the sintering of particles 6, whose volume contracts to 1/10 to 1/50 of its original value. Particles 6 become transparent glass and form a glass bulk substrate, resulting in good adhesion between substrates 1 and 4. Therefore, no compressing means is necessary.

When He gas was used during annealing, it was confirmed that the bubbles were eliminated from a layer constituted by particles 6 during annealing.

In the above embodiment, the flow rates of He and $O_2$ gases are respectively 2 l/min and 0.5 l/min. However, other gases may be used. For example, an Ar or $N_2$ gas atmosphere may be used during annealing.

Next, the joined substrate is removed from furnace 7 and polished from the (back) side of substrate 1 having no V-grooves as shown in FIG. 1(c). The spaces between the edges of V-grooves constitute a plurality of monocrystalline semiconductor isolation regions 1a surrounded by dielectric film 3. Element formation region substrate 8, sandwiching glass bulk body 6a between substrate 4 and film 3, is thus formed.

In the step shown in FIG. 1(a), the halide source gas can supply to burner 4 tetrachlorosilane ($SiCl_4$) as a major component and additionally a melting point control material such as boron trichloride ($BCl_3$) or phosphorus trichloride ($PCl_3$), using Ar gas as a carrier gas. After supplying this source gas to burner 4, flame hydrolysis can be performed. The resultant glass particles may contain silicon (Si) oxide and a boron (B) or phosphorus (P) oxide such as boron trioxide ($B_2O_3$) or phosphorus pentoxide ($P_2O_5$). $BCl_3$ can be supplied as a gas. $PCl_3$ is supplied by bubbling using Ar gas as a carrier gas. In this case, a $PCl_3$ thermostant temperature is 30° C., and an Ar gas flow rate is 30 cc/min. By changing the dose of the melting point control material, the softening and melting points of the glass material can be freely controlled.

FIG. 2 is a graph showing the relationship of oxide content (mol %), i.e., the melting point control material content of silicon dioxide ($SiO_2$) and glass softening point (°C.). If germanium dioxide ($GeO_2$), boron trioxide ($B_2O_3$), or phosphorus pentoxide ($P_2O_5$) was used as a melting point control material oxide, an increase in oxide content can bring about a reduction in the glass softening point.

In addition, when two or more types of an $SiCl_4$ melting point control material are doped, the change in glass softening point is proportional to the doping ratios of the two materials.

The glass particles produced by flame hydrolysis have particle sizes of 0.05 to 0.2 μm. A transparentizing temperature of these glass particles is as low as that of glass of a low melting point. However, once the particles are transparentized, their melting point is determined by the contents of other components such as $BCl_3$ and $PCl_3$, excluding $SiCl_4$ as the major constituent. For example, glass particles containing 20 mol % of $B_2O_3$ are transparentized at a temperature of 900° C. (i.e., the adhesion effect is provided). After the particles are transparentized, the melting point becomes as high as about 1,400° C. Therefore, the element formation region is not subjected to reflow at the time of formation of elements.

Furthermore, an element formation substrate was fabricated by performing flame hydrolysis on a source of
$BCl_3$: 99 cc/min
$SiCl_4$: 170 cc/min,
with an oxyhydrogen flame consisting of $H_2$ supplied at 1.5 l/min and $O_2$ supplied at 5.5 l/min. The resistivity of the element surface of the resulting substrate was measured at 36 Ω·cm, thus showing that the auto-doping of B is insignificant.

Element formation regions 1a of substrate 8 prepared in this way are isolated as island regions by the respective guard rings. As a result, high-performance semiconductor elements can be provided in a mass production line.

Substrate 4 as a support used in the present invention need not be monocrystalline silicon of high crystallographic quality. Any wafer regarded as a defective wafer having resistivity variations, crystal defects and defective crystallographic orientation can be used as substrate 4. Defective wafer is inexpensive and glass particles can be produced at low cost, and thus an inexpensive method of joining semiconductor substrates can be realized.

Figure 3B:
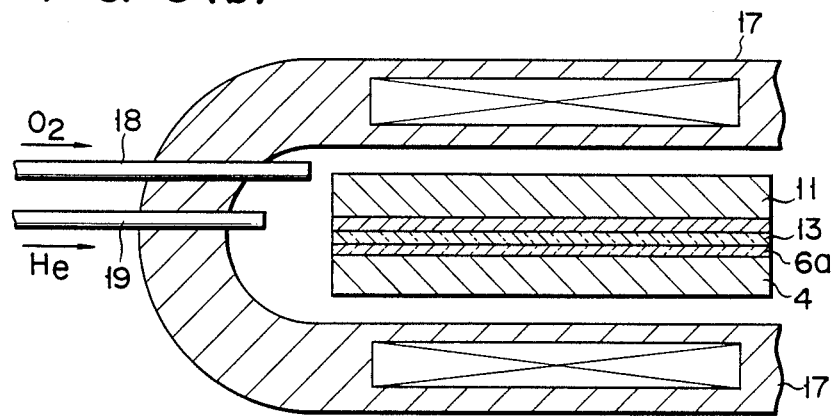
Figure 3C:
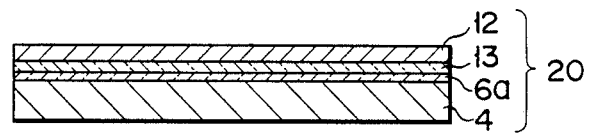

FIGS. 3(a) to 3(c) show another embodiment of the present invention and exemplify a method of jointing p$^-$-type epitaxial layer 12 having a crystal plane of (100) with support substrate 4 to constitute element formation substrate 20.

Referring to FIGS. 3(a) to 3(c), reference numeral 11 denotes a p$^+$-type Si substrate having a crystal plane of (100); 12, a p$^-$-type epitaxial layer having a crystal plane of (100); 13, a thermal oxide film formed by oxidizing layer 12; and 4, a support semiconductor substrate to be joined to layer 12. Particles 6 (a compound of $SiO_2$ and $B_2O_3$, which is derived from $SiCl_4$ and $BCl_3$ as starting materials) were sprayed by burner 4 on film 13 to deposit the glass particles thereon (FIG. 3(a)) in the same manner as the previous embodiment. As shown in FIG. 3(b), $O_2$ and He gases are supplied to heating furnace 17 through pipes 18 and 19 after substrate 4 as a support is placed on particles 6, and the resultant structure is placed in furnace 17, thereby sintering particles 6 in an atmosphere of a gas mixture of He and $O_2$, as shown in FIG. 3(b). Particles 6 are transparentized to form transparent glass layer 6a, and joining is completed. The opposite surface of p$^+$-type Si substate 11 having a crystal plane of (110) is polished or etched to p$^-$-type Si expose layer 12 having a crystal plane of (110) and hence obtain a thin epitaxial Si film on an $SiO_2$ insulating film, i.e., an SOI (Silicon on Insulator). In this case, when HF-HNO$_3$-HAc is used as an etchant, the p$^+$-type Si substrate is selectively etched up to the p$^-$-type Si layer. Therefore, the p$^+$-type Si substrate is completely removed while completely leaving layer 12 (FIG. 3(c)).

The source containing $SiCl_4$ as a major constituent is supplied to burner 4 in the same manner as in the first embodiment. The same effect as in the first embodiment can be substantially obtained in the second embodiment.

The above embodiments exemplify the processes using silicon halogenide compounds. However, $SiH_4$ gas may be used. Impurity additives may be $B_2H_6$ and $PH_3$ gases.

What is claimed is:

1. A method of manufacturing a semiconductor substrate, comprising the steps of:
    flame hydrolyzing with an oxyhydrogen flame, at least one of $SiH_4$ gas and a silicon halogenide compound and further at least one dopant of boron trichloride and phosphorous trichloride, to form glass particles containing silicon dioxide, spray-depositing said glass particles onto a surface of an oxide insulating film carried on a semiconductor substrate;
    placing a second substrate, serving as a support, on said glass particles deposited on said insulating film of said semiconductor substrate to thereby form a layered structure; and
    heat-treating said layered structure by heating to a temperature of 800° C. to 1,300° C. and which is a sintering temperature of the glass particles, in an atmosphere of helium and oxygen gases to thereby sinter said glass particles to join said semiconductor substrate with said second substrate.

2. The method according to claim 1, wherein the step of depositing said resultant glass particles includes the step of controlling the flow of hydrogen used during flame hydrolysis of said source with an oxyhydrogen flame to produce said glass particles.

3. The method according to claim 1, wherein the step of depositing said glass particles comprises the step of depositing said glass particles while heating said semiconductor substrate.

4. The method according to claim 1, wherein said silicon halogenide is a silicon halogenide compound of trichlorosilane or tetrachlorosilane and further contains germanium tetrachloride ($GeCl_4$).

5. The method according to claim 1, wherein said semiconductor substrate comprises a silicon substrate having a plurality of V-grooves formed in a surface, said insulating film is a silicon dioxide film formed on an entire surface including inner surfaces of the V-grooves, and the glass particles are sprayed on said silicon dioxide film.

6. The method according to claim 5, wherein the step of depositing said glass particles includes the step of controlling the flow of hydrogen used during flame hydrolysis of said source with an oxyhydrogen flame to produce said resultant glass particles.

7. The method according to claim 5, wherein the step of depositing said glass particles comprises the step of depositing said glass particles while heating said semiconductor substrate.

8. The method according to claim 5, wherein said silicon halogenide compound is a silicon halogenide compound of trichlorosilane or tetrachlorosilane and further contains germanium tetrachloride ($GeCl_4$).

9. The method according to claim 8, further including the step of polishing an opposite surface without said V-grooves until vertices of said V-grooves are exposed.

10. The method according to claim 1, wherein said semiconductor substrate comprises a semiconductor substrate containing an impurity of high concentration, a semiconductor epitaxial layer containing an impurity of a low concentration, said semiconductor epitaxial layer being formed on said semiconductor substrate containing the impurity of the high concentration, and a silicon oxide film as an insulating film formed on said semiconductor epitaxial layer.

11. The method according to claim 1, wherein said $SiH_4$ gas is used.

12. The method according to claim 1, wherein said semiconductor substrate comprises a semiconductor substrate containing an impurity of high concentration, a semiconductor epitaxial layer containing an impurity of a low concentration, said semiconductor epitaxial layer being formed on said semiconductor substrate containing the impurity of the high concentration, and a silicon oxide film as an insulating film formed on said semiconductor epitaxial layer.

13. The method according to claim 1, wherein said heat-treating is accomplished by heating said layered structure to a temperature of 800° C. to 1100° C. to sinter said glass particles to join said semiconductor substrate with said second substrate.

14. The method according to claim 1 wherein said heat-treating is accomplished by heating said layered structure to a temperature of 1100° C. to 1200° C. to sinter said glass particles to join said semiconductor substrate with said second substrate.

15. The method according to claim 1, wherein said semiconductor substrate comprises a silicon substrate having a plurality of V-grooves formed in a surface, said insulating film is a silicon dioxide film formed on an entire surface including inner surfaces of the V-grooves, and the glass particles are sprayed on said silicon dioxide film.

16. The method according to claim 15, further including the step of polishing an opposite surface without said V-grooves until vertices of said V-grooves are exposed.

17. The method according to claim 1, wherein the step of depositing said glass particles includes the step of controlling the flow of hydrogen used during flame hydrolysis of said source with an oxyhydrogen flame to produce said resultant glass particles.

* * * * *